US006383660B2

(12) United States Patent
Igarashi

(10) Patent No.: US 6,383,660 B2
(45) Date of Patent: May 7, 2002

(54) EPOXY RESIN COMPOSITION FOR ENCAPSULATING SEMICONDUCTOR AND SEMICONDUCTOR DEVICE USING THE SAME

(75) Inventor: Kazumasa Igarashi, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/826,865

(22) Filed: Apr. 6, 2001

(30) Foreign Application Priority Data

Apr. 6, 2000 (JP) ........................................ 2000-105055

(51) Int. Cl.$^7$ .............................................. H01L 29/12
(52) U.S. Cl. ...................... 428/620; 257/789; 257/794; 257/795; 523/443; 523/444
(58) Field of Search ................................. 523/443, 444; 428/620; 257/789, 794, 795

(56) References Cited

PUBLICATIONS

Abstract of JP 10–298407 A filed Apr. 23, 1997 (Published Nov. 10, 1998).
Abstract of JP 61237455 filed Oct. 22, 1986.
Abstract of JP 62161851 filed Jul. 17, 1987.
Abstract of JP 05009270 filed Jan. 19, 1993.
Abstract of JP 05206325 filed Aug. 13, 1993.
Abstract of JP 05283561 filed Oct. 29, 1993.

*Primary Examiner*—Robert Dawson
*Assistant Examiner*—D. Aylward
(74) *Attorney, Agent, or Firm*—Birch, Stewart, Kolasch & Birch, LLP

(57) ABSTRACT

An epoxy resin composition for encapsulating a semiconductor device comprising as essential components (A) an epoxy resin; (B) a phenolic resin; (C) a curing accelerator; and (D) a hollow inorganic filler having an average particle size of 4 to 100 $\mu$m and an average shell thickness of 1.5 $\mu$m or more, wherein the amounts of the component (A) and the component (B) are adjusted such that a total amount of X and Y (X+Y) is 350 or more, wherein X is an epoxy equivalent of the epoxy resin (A), and Y is a hydroxyl group equivalent of the phenolic resin (B); and a semiconductor device comprising a semiconductor element encapsulated by the epoxy resin composition.

7 Claims, No Drawings

EPOXY RESIN COMPOSITION FOR ENCAPSULATING SEMICONDUCTOR AND SEMICONDUCTOR DEVICE USING THE SAME

BACKGROUND OF THE INVENTION

1. Field of the Invention

The present invention relates to a low-dielectric constant epoxy resin composition for encapsulating a semiconductor, the epoxy resin composition having a remarkably reduced specific dielectric constant, and a semiconductor device in which a semiconductor element is resin-encapsulated by using the epoxy resin composition.

2. Discussion of the Related Art

Conventionally, a resin-encapsulating type semiconductor device, comprising a semiconductor element such as a transistor, IC or LSI and an encapsulating material such as an epoxy resin composition, wherein the semiconductor element is encapsulated by molding the encapsulating material by transfer molding, has been widely used along with ceramic-encapsulating type semiconductor devices, because of reliability, mass-productivity and low costs of the resin-encapsulating type semiconductor device.

However, recently, high-functionalizing and high-performance of the semiconductor element of a microprocessor or the like have been contrived. With such contrivances, operating frequency tends to be markedly increased. In addition, in the fields associated with information communication, the frequency band in miniaturized electronic devices such as cellular phones and PHS near giga-Hertz has been used, and the development of the communication using a two-digit giga-Hertz band has been currently progressed.

With the trend of high-frequency development in the semiconductor devices, ceramic-encapsulating type semiconductor devices having excellent high-frequency characteristics have been presently employed in a large number for semiconductor devices requiring high reliabilities. On the other hand, however, a current project is to employ a low cost resin-encapsulating type semiconductor device which is excellent in mass-productivity and various reliabilities mentioned above. Therefore, the development of an epoxy resin composition with a low dielectric constant for a low-pressure transfer molding has been in demand to be used in the resin-encapsulating type semiconductor device.

In addition, there have been proposed a process of resin-encapsulating a semiconductor by using a silicone resin having a low dielectric constant; a process utilizing a double molding technique, in which a semiconductor element is molded with a low-dielectric constant resin in the inner layer, and with a conventional epoxy resin in the outer layer (Japanese Patent Laid-Open No. Sho 61-237455); a process utilizing a hollow inorganic filler such as glass hollow spheres (Japanese Patent Laid-Open No. Hei 5-283561); and the like. However, there is a limitation in the lowering of the dielectric constant of the encapsulating resin. With the present ever increasing progress in the trend of high-frequency development of the semiconductor element, the desired lowering of the dielectric constant cannot yet be accomplished.

In addition, as the epoxy resin composition using a hollow inorganic filler for low-pressure transfer molding, which is used for resin-encapsulating the semiconductor element, Japanese Patent Laid-Open No. Sho 62-161851 discloses an epoxy resin composition for encapsulating a semiconductor wherein a silica having a void in its inner part is used as all or a part of the inorganic filler. However, this publication is completely silent on the dielectric properties of the cured product. On the other hand, Japanese Patent Laid-Open No. Hei 5-9270 discloses an epoxy resin composition for encapsulating a semiconductor in which the composition has a lowered dielectric constant, wherein the hollow inorganic filler constitutes 30 to 100% by weight of the inorganic filler. However, since the hollow structure is broken down by applying a shearing force during kneading or melt-dispersion of various added components, there is a disadvantage from the viewpoint of the productivity that not all of the raw materials can be kneaded at once. In addition, Japanese Patent Laid-Open No. Hei 5-206325 discloses a resin composition for encapsulating a semiconductor using a gas-containing filler, wherein the dielectric constant of the cured product of the resin composition is 3.5 or less at 50° C. in a frequency band of 1 MHz to 50 GHz. However, the resin composition disclosed in this publication can be hardly said to be a filler-containing resin composition favorably encapsulating a semiconductor having a narrow-pitched wiring structure of the recent development.

Accordingly, in view of the advancement in the development of a high-frequency semiconductor element, an object of the present invention is to provide an epoxy resin composition for encapsulating a semiconductor which has a further reduced specific dielectric constant matching the demands of the trend of high-frequency development, is favorable in the assembly of the semiconductor having a narrow-pitched wiring structure, and has excellent productivity.

Another object of the present invention is to provide a semiconductor device which is resin-encapsulated by using the epoxy resin composition.

These and other objects of the present invention will be apparent from the following description.

SUMMARY OF THE INVENTION

A first embodiment of the present invention pertains to an epoxy resin composition for encapsulating a semiconductor device comprising as essential components:

(A) an epoxy resin;
(B) a phenolic resin;
(C) a curing accelerator; and
(D) a hollow inorganic filler having an average particle size of 4 to 100 $\mu$m and an average shell thickness of 1.5 $\mu$m or more, wherein the amounts of the component (A) and the component (B) are adjusted such that a total amount of X and Y (X+Y) is 350 or more, wherein X is an epoxy equivalent of the epoxy resin (A), and Y is a hydroxyl group equivalent of the phenolic resin (B).

A second embodiment of the present invention pertains to a semiconductor device comprising a semiconductor element encapsulated by the epoxy resin composition described above.

As a result of intensive studies in view of accomplishing the above objects, the present inventor has remarked on the epoxy resin and the phenolic resin, which are organic components of the epoxy resin composition for encapsulating a semiconductor, and found that the reduction of a concentration of secondary hydroxyl group of the product formed after the reaction of these components is effective in lowering the dielectric constant, i.e., adjustment of a total amount of the epoxy equivalent of the epoxy resin and the hydroxyl equivalent of the phenolic resin to a specified value or higher. Also, the present inventor has found that in addition to the above adjustment in the organic components, since a hollow inorganic filler is used as an inorganic filler together with the organic components of the above-mentioned epoxy resin composition, there can be obtained an epoxy resin composition of which specific dielectric constant is further reduced. This specific dielectric constant matches the development of the high-frequency trend of the semiconductor element.

In addition, when, for instance, a hollow silica balloon, a hollow Shirasu balloon, a hollow glass balloon, or a hollow sphere comprising a silicon oxide and aluminum oxide, and a hollow material comprising various other ceramics is supplied to a conventional process for preparing a conventional epoxy resin composition as a gas (air)-containing hollow inorganic filler, the hollow material is liable to be broken down in the heating and kneading-dispersion process in which a strong shearing force is applied by a kneader, a heat roller or the like. Therefore, it has been necessary to use a hollow inorganic filler having a shell strength strong enough to withstand the above-mentioned heating and kneading-dispersion process.

Further, the semiconductor element is provided with a narrow-pitched wiring of 80 to 100 μm according to the wire bonding method, which is a representative example of the electrical wiring of the semiconductor element of the recent trend. Therefore, the present inventor has found that a particle size of the inorganic filler used in the epoxy resin composition has to be adjusted, so that the maximal particle size is made even smaller in order not to hinder the wiring.

Moreover, the semiconductor package has been becoming increasing thin and miniaturized, so that it has been desired to further lower the viscosity in the melt viscosity of the epoxy resin composition for low-pressure transfer molding which encapsulates the package. Therefore, it has been earnestly desired to lower the viscosity by forming the inorganic filler into a spherical shape.

Specifically, as a result of intensive studies on the basis of the above findings, the present inventor has found that when the total amount of the epoxy equivalent of the epoxy resin and the hydroxyl equivalent of the phenolic resin is adjusted to a specified value or higher, a concentration of secondary hydroxyl group of the product formed after the reaction is reduced, thereby making it effective in lowering the dielectric constant, and that when the hollow inorganic filler (D) having a specified average particle size and a specified shell thickness is further used, a further lowering of the dielectric constant is accomplished without breaking the hollow inorganic filler mentioned above even when a strong shearing force is applied during the preparation process of the raw materials.

Therefore, it is especially preferable to use the specified epoxy resin represented by the formula (1) as the epoxy resin (A) together with the specified phenolic resin represented by the formula (2) as the phenolic resin (B), in which a total amount of the epoxy equivalent and the hydroxyl group equivalent is high, so that the specific dielectric constant of the resulting cured product of the epoxy resin composition is even further reduced.

Especially, it is preferable to use the hollow glass balloon as the hollow inorganic filler, because there are exhibited such effects that the lowering of the dielectric constant can be achieved, and that the weight of the semiconductor device obtained by molding the epoxy resin composition of the present invention can be reduced.

DETAILED DESCRIPTION OF THE INVENTION

Next, the embodiments of the present invention will be described in detail below.

The epoxy resin composition for encapsulating a semiconductor (hereinafter simply referred to as "epoxy resin composition") of the present invention is obtained from an epoxy resin [Component (A)], a phenolic resin [Component (B)], a curing accelerator [Component (C)], and a specified hollow inorganic filler [Component (D)], and the epoxy resin composition is usually in the form of powder or tabletted into a tablet. Alternatively, after the epoxy resin composition is melt-kneaded, the composition is molded into a granular form of an approximate cylindrical shape.

As the epoxy resin [Component (A)], any of conventionally known various epoxy resins can be used without particular limitations, as long as a total amount of an epoxy equivalent of the epoxy resin and a hydroxyl group equivalent of the phenolic resin mentioned below is a specified value or higher, and the epoxy resin is solid at an ordinary temperature (25° C.). The epoxy resin includes, for instance, biphenyl epoxy resins, phenol novolak epoxy resins, cresol novolak epoxy resins, and the like. These epoxy resins can be used alone or in combination of two or more kinds. Concrete examples of the epoxy resin include an epoxy resin represented by the formula (1):

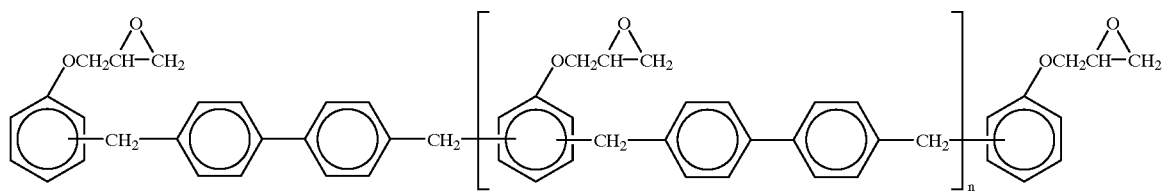

(1)

wherein n is 0 or a positive number;

an epoxy resin represented by the formula (3):

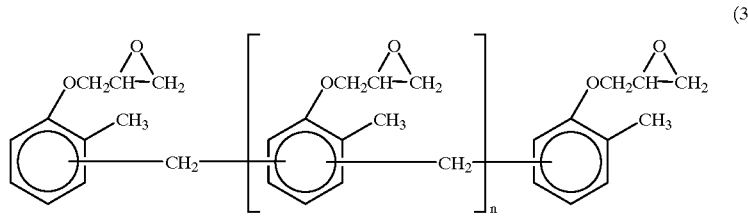
(3)

wherein n is 0 or a positive number;
an epoxy resin represented by the formula (4):

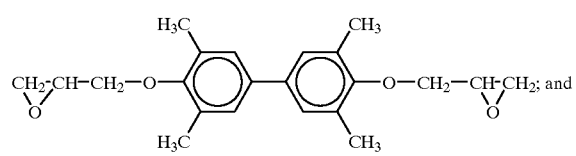
(4)

an epoxy resin represented by the formula (5):

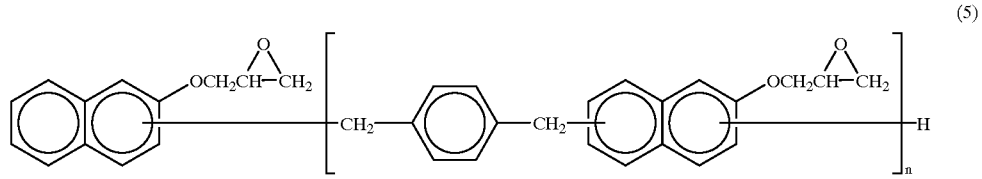
(5)

wherein n is 0 or a positive number.

The phenolic resin [Component (B)] may be any of those acting as a curing agent for the epoxy resin [Component (A)], and any phenolic resin may be used as long as a total amount of the hydroxyl group equivalent of the phenolic resin and the epoxy equivalent of the epoxy resin mentioned above is a specified value or higher. The phenolic resin includes, for instance, phenol novolak, cresol novolak, bisphenol A novolak, naphthol novolak, phenol aralkyl novolak, and the like. These phenolic resins can be used alone or in combination of two or more kinds. Concrete examples thereof include a phenolic resin represented by the formula (2):

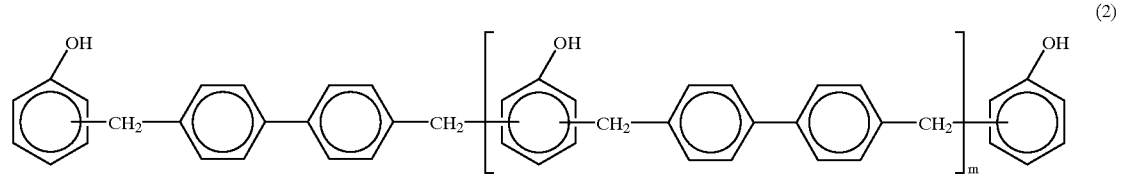
(2)

wherein m is 0 or a positive number;

a phenolic resin represented by the formula (6):

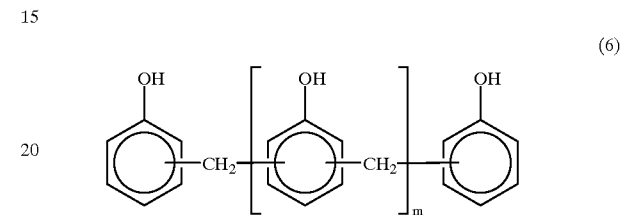
(6)

wherein m is 0 or a positive number;

a phenolic resin represented by the formula (7):

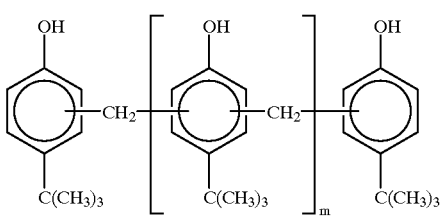
(7)

wherein m is 0 or a positive number; and a phenolic resin represented by the formula (8):

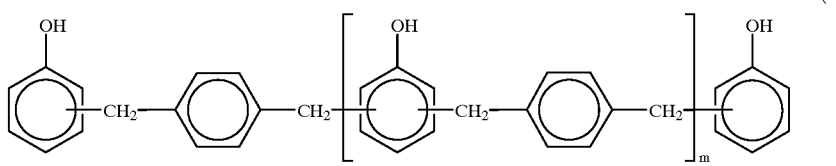

(8)

wherein m is 0 or a positive number.

It is preferable that the ratio of the epoxy resin [Component (A)] to the phenolic resin [Component (B)] is adjusted such that the hydroxyl group equivalent in the phenolic resin is within the range of 0.5 to 1.6, more preferably within the range of 0.8 to 1.2, per one equivalent of the epoxy group in the epoxy resin.

Next the curing accelerator [Component (C)] which is used together with Component (A) and Component (B) is not particularly limited, and any of conventionally known ones can be used. Concrete examples thereof include 1,8-diazabicyclo[5.4.0]undecene-7; tertiary amines such as triethylenediamine; imidazoles such as 2-methylimidazole; phosphorus-containing curing accelerators such as triphenylphosphine and tetraphenylphosphonium tetraphenyl borate; and the like. These curing accelerators can be used alone or in admixture of two or more kinds.

It is preferable that the content of the curing accelerator [Component (C)] is adjusted to 0.5 to 10 parts by mass, based on 100 parts by mass of the phenolic resin [Component (B)].

As the specified hollow inorganic filler [Component (D)] which is used together with Components (A) to (C), the hollow inorganic filler particle satisfies the requirements that the average particle size is from 4 to 100 μm, that the thickness of the shell constituting the hollow inorganic filler is 1.5 μm or more. It is more preferable that the maximal particle size is 150 μm or less. It is especially preferable that the average particle size is from 10 to 70 μm that the thickness of the shell constituting the hollow inorganic filler is 1.5 to 4 μm or less, and that the maximal particle size is 110 μm or less. Specifically, when the average particle size is less than 4 μm, the content of the gas (air) contained in the hollow particle is lowered, so that the lowering of the dielectric constant cannot be attained to a desired level. Also, when the average particle size exceeds 100 μm, there arises impediment in the electric wiring of the semiconductor element. Further, when the thickness of the shell is less than 1.5 μm, there is a possibility that the hollow particle, is broken down due to the lack of the strength of the hollow particle in the heating and kneading-dispersion process in which a strong shearing force is applied by using a kneader and a heat roller. Also, when the maximal particle size exceeds 150 μm, there is a possibility of impediment in the electric wiring of the semiconductor element.

The hollow inorganic filler defined above includes, for instance, a hollow silica balloon, a hollow Shirasu balloon, a hollow glass balloon a hollow sphere made of a composition comprising silicon oxide and aluminum oxide, hollow materials such as various ceramics, and the like. Among them, the hollow glass balloon is preferably used, from the viewpoint of strong shell strength. More preferably, a hollow glass balloon having an average particle size of from 30 to 60 μm, a maximal particle size of 110 μm or less, an average thickness of the shell of 2 to 4 μm, and a true density of from 0.70 to 0.80 g/cm$^3$, and has a high-compression strength such that a breakdown ratio is 10% or less when pressed at a hydrostatic pressure of 6864 N/cm$^3$. Further, when the surface of the hollow inorganic filler particle is previously coated with the silane coupling agent described below, it is preferable because the adhesion at the interface of the inorganic filler and the organic components such as the epoxy resin and the phenolic resin described above is improved, thereby desirably stabilizing the dielectric properties when the moisture is absorbed.

In the present invention, conventional various inorganic fillers can be used together with the hollow inorganic filler [Component (D)]. The conventional inorganic filler includes, for instance, silica powder such as fused silica, alumina, silicon nitride, aluminum nitride, boron nitride, magnesia, calcium silicate, magnesium hydroxide, titanium white, and the like. Among the inorganic fillers, spherical silica powder, ground silica powder, friable silica powder, and the like can be preferably used. As the inorganic filler, those having a maximal particle size of 100 μm or less are preferable. In addition, besides the above-defined maximal particle size, those having an average particle size of from 1 to 20 μm are preferable. Therefore, when the conventional inorganic filler is used together with the hollow inorganic filler [Component (D)], it is preferable that the formulation proportion of the conventional inorganic filler is adjusted to 30% by mass or less of the entire fillers (a total of the hollow inorganic filler and the conventional inorganic filler). This is because when the formulation ratio of the conventional inorganic filler exceeds 30% by mass, it would be difficult to lower the dielectric constant to a desired level.

Here, the maximal particle size and the average particle size of the hollow inorganic filler and the conventional inorganic filler can be determined by using, for instance, a laser diffraction scattering-type particle size distribution analyzer. In addition, the shell thickness of the hollow inorganic filler can be determined by, for instance, observing a sample intentionally broken down with an electron microscope.

It is preferable that the proportion of the content of the hollow inorganic filler [Component (D)] (or the proportion of the content of a total of the hollow inorganic filler and the conventional inorganic filler, in a case where the hollow inorganic filler is used together with the conventional inorganic filler) is adjusted to a range of 40 to 70% by mass, more preferably 40 to 60% by mass, of an entire epoxy resin composition. Specifically, when the proportion of the content of the hollow inorganic filler [Component (D)] is less than 40% by mass, it would be difficult to lower the dielectric constant to a desired level. Also, when the proportion of the content of the hollow inorganic filler [Component (D)] exceeds 70% by mass, the melt viscosity of the epoxy resin composition becomes remarkably high and the fluidity is lowered, thereby making it difficult to mold the epoxy resin composition by low-pressure transfer molding.

In the epoxy resin composition of the present invention, there can be optionally added various auxiliary agents such as a mold-releasing agent, a flexibility imparting agent a pigment, a flame retarder and a coupling agent in proper amounts, in addition to the epoxy resin [Component (A)], the phenolic resin [Component (B)], the curing accelerator [Component (C)], the hollow inorganic filler [Component (D)], and the conventional inorganic filler.

The mold-releasing agent includes polyethylene waxes, carnauba wax, salts of fatty acids, and the like.

The flexibility imparting agent includes silicone compounds such as side-chain ethylene glycol type dimethyl siloxane; acrylonitrile-butadiene rubbers; and the like.

The pigment includes carbon blacks, titanium oxide, and the like.

The flame retarder includes halogen-based flame retarders such as brominated epoxy resins, which is used together with a flame retardant aid such as antimony trioxide.

Further, as a flame retarder other than the halogen-based flame retarders mentioned above, there can be used a composite metal hydroxide having a polyhedral shape represented by the general formula (9):

$$M_{1-x}Q_x(OH)_2 \qquad (9)$$

wherein M is at least one metal atom selected from the group consisting of Mg, Ca, Sn and Ti; Q is at least one metal atom selected from the group consisting of Mn, Fe, Co, Ni, Cu and Zn; and X is a positive number of 0.01 to 0.5. This composite metal hydroxide has the crystalline structure of a polyhedral form. It does not have a conventional hexahedral form, or a platy form having thin thickness such as scaly form for the crystalline structure. Rather, it refers to a composite metal hydroxide having large crystal growth in the direction of thickness (c-axis direction) as well as in the length and width directions, including, for instance, those having a granular crystalline form which are made to resemble steric and spherical form by the crystal growth of a platy crystal in the direction of thickness (c-axis direction), the granular crystalline forms including, approximate dodecahedron, approximate octahedron, approximate tetrahedron, and the like.

For instance, the composite metal hydroxide having large crystal growth in the direction of thickness (c-axis direction) as well as in the length and width directions, and a desired polyhedral crystalline form, which is in the form of approximate dodecahedron, approximate octahedron, approximate tetrahedron, or the like, can be obtained by controlling various conditions in the manufacturing process of the composite metal hydroxide, and may be usually a mixture of various shapes.

Concrete representative examples of the composite metal hydroxide having a polyhedral shape mentioned above include a hydrate of magnesium oxide and nickel oxide, a hydrate of magnesium oxide and zinc oxide, a hydrate of magnesium oxide and copper oxide, and the like.

Also, the composite metal hydroxide having the polyhedral shape has the following particle size distributions (α) to (γ), as determined by a laser diffraction particle size analyzer:

(α): 10 to 35% by mass of those having a particle size of less than 1.3 μm;

(β): 50 to 65% by mass of those having a particle size of 1.3 μm or more and less than 2.0 μm; and (γ): 10 to 30% by mass of those having a particle size of 2.0 μm or more.

In addition, the composite metal hydroxide having a polyhedral form has an aspect ratio of preferably from 1 to 8, more preferably from 1 to 7, more preferably from 1 to 4. The aspect ratio referred to herein is expressed by a ratio of length to width of the composite metal hydroxide. When the aspect ratio exceeds 8, the effect on a decrease in the viscosity becomes poor when an epoxy resin composition comprising the composite metal hydroxide is melted. When the composite metal hydroxide is used as a constituent of the epoxy resin composition of the present invention, those generally having an aspect ratio of 1 to 4 can be used.

The coupling agent includes silane coupling agents such as γ-glycidoxypropyl trimethoxysilane, β-(3,4-epoxycyclohexyl)ethyl trimethoxysilane, and the like.

In the epoxy resin composition of the present invention, it is required that the epoxy resin and the phenolic resin are used in combination such that a total amount of X and Y (X+Y) is adjusted to 350 or more, wherein X is an epoxy equivalent of the epoxy resin (A), and Y is a hydroxyl group equivalent of the phenolic resin (B). Especially a combination in which the total amount (X+Y) is 400 or more is preferable. Incidentally, the upper limit of the total amount (X+Y) is 2000 or so. Specifically, when the total amount (X+Y) is less than 350, a satisfactory effect of reducing the dielectric constant of the resulting cured product of the epoxy resin composition cannot be obtained. As to the combination of the epoxy resin [Component (A)] and the phenolic resin [Component (B)], it is preferable that the use of a combination of the epoxy resin represented by the formula (1) mentioned above and the phenolic resin represented by the formula (2) mentioned above is preferable, from the viewpoints of attaining an especially high total amount of the epoxy equivalent and the hydroxyl group equivalent, thereby obtaining a satisfactory effect of reducing the dielectric constant. In addition, when two or more resins are used in combination for the epoxy resin (A), the average mass of the epoxy equivalent of these plural epoxy resins is defined as the epoxy equivalent X. When two or more resins are used in combination for the phenolic resin (B), the average mass of the hydroxyl group equivalent of these plural phenolic resins is defined as the hydroxyl group equivalent Y. Each of these epoxy equivalent and hydroxyl group equivalent is expressed by g/eq. In the present invention, the total amount (X+Y) of the epoxy equivalent X and the hydroxyl group equivalent Y as defined above does not include the epoxy equivalent of the epoxy resin which is used as a flame retarder such as a brominated epoxy resin.

The epoxy resin composition of the present invention can be prepared, for instance, as follows. Specifically, a desired epoxy resin composition can be prepared by a series of steps comprising adding an epoxy resin [Component (A)], a phenolic resin [Component (B)], a curing accelerator [Component (C)], a hollow inorganic filler [Component (D)], and various auxiliary agents such as a mold-releasing agent in given amounts, sufficiently mixing the components by melt-dispersion by using a heat roller and an extruder-kneader, cooling the mixture, and pulverizing the mixture, and optionally subjecting the mixture to compression-molding into a form of tablet.

In addition, as mentioned above, the epoxy resin composition may be prepared by previously mixing a hollow inorganic filler [Component (D)] with a silane coupling agent, thereby surface-coating the surface of the hollow inorganic filler [Component (D)] with the silane coupling agent, and thereafter adding the remaining components for carrying out the steps described above. By previously surface-coating the surface of the hollow inorganic filler [Component (D)] described above, the adhesion of the interface of the hollow inorganic filler and the organic components is improved, thereby stabilizing the dielectric properties when the encapsulated resin (cured product) absorb moisture.

The semiconductor device of the present invention comprises a semiconductor element encapsulated by the epoxy resin composition described above. Here, the encapsulating is not particularly limited, and can be carried out by a usually known molding process such as low-pressure transfer molding.

The semiconductor device obtained as described above has excellent high-frequency properties. This is because the epoxy resin composition used as a encapsulating resin composition for the semiconductor device comprises the epoxy resin and the phenolic resin which are used in combination such that a total amount of the epoxy equivalent of the epoxy resin and the hydroxyl group equivalent is a specified value or higher, and that a gas(air)-containing hollow inorganic filler is contained in a specified amount, so that the resulting epoxy resin composition has low dielectric constant with a markedly lowered specific dielectric constant. Especially, with the trend of high-frequency semiconductor elements, the semiconductor device which is encapsulated by the epoxy resin composition of the present invention has small inter-terminal capacity between the lead pins, so that a loss in the transmission of high-frequency signals can be reduced.

EXAMPLES

Next, Examples are described hereinbelow together with Comparative Examples.

First, prior to carrying out the Examples, each of the following components was prepared.

[Epoxy Resin a]

An epoxy resin (epoxy equivalence: 195 g/eq., softening point: 74° C.), represented by the following formula (a):

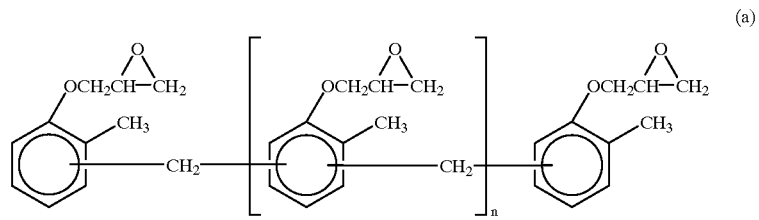

(a)

[Epoxy Resin b]

An epoxy resin (epoxy equivalence: 192 g/eq., melting point: 107° C.), represented by the following formula (b):

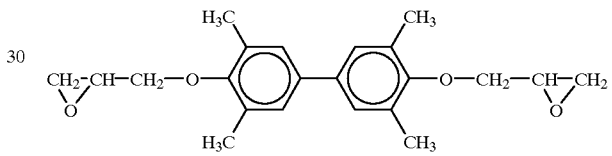

(b)

[Epoxy Resin c]

An epoxy resin (epoxy equivalence: 273 g/eq., softening point: 61° C.), represented by the following formula (c):

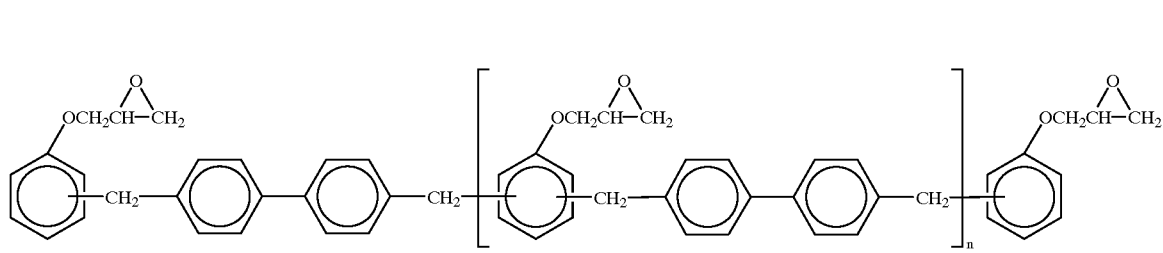

(c)

[Epoxy Resin d]

An epoxy resin (epoxy equivalence: 290 g/eq., softening point: 95° C.), represented by the following formula (d):

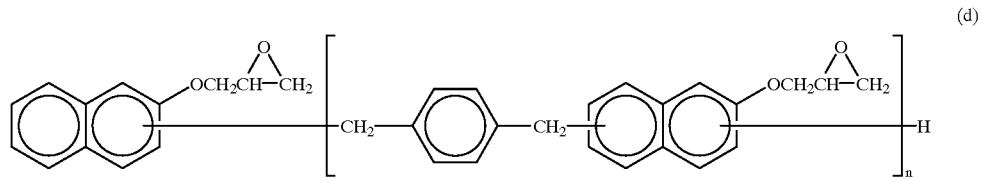

(d)

[Phenolic Resin a]

A phenolic resin (hydroxyl group equivalence: 106 g/eq., softening point: 82° C.), represented by the following formula (a):

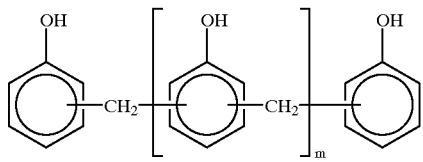

(a)

[Phenolic Resin b]

A phenolic resin (hydroxyl group equivalence: 162 g/eq., softening point: 60° C.), represented by the following formula (b):

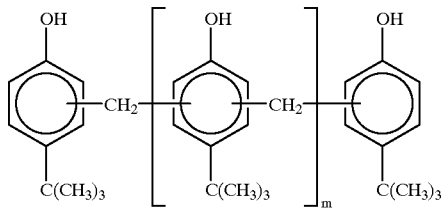

(b)

[Phenolic Resin c]

A phenolic resin (hydroxyl group equivalence: 170 g/eq., softening point: 70° C.), represented by the following formula (c):

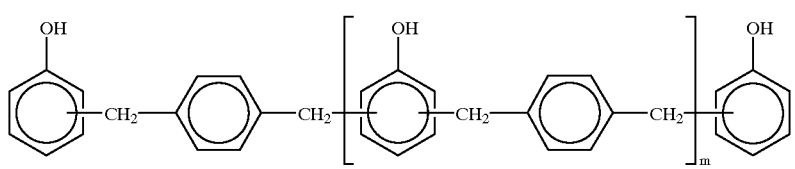

(c)

[Phenolic Resin d]

A phenolic resin (hydroxyl group equivalence: 208 g/eq., softening point: 69° C.), represented by the following formula (d):

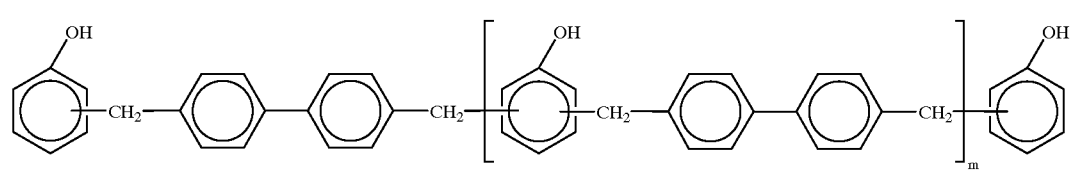

(d)

[Curing Accelerator]

Tetraphenylphosphonium tetraphenylborate

[Hollow Inorganic Filler a]

A hollow glass balloon (made of borosilicate glass, average particle size: 40 μm, maximal particle size: 110 μm, average shell thickness: 2 μm, true density: 0.75 g/cm$^3$, breaking ratio: 6% when pressed at hydrostatic pressure of 6864 N/cm$^3$)

[Hollow Inorganic Filler b]

A hollow glass balloon (made of borosilicate glass, average particle size: 40 μm, maximal particle size: 80 μm, average shell thickness: 1 μm, true density: 0.39 g/cm$^3$, breaking ratio: 6% when pressed at strength of 2451 N/cm$^3$)

[Silica Powder a]

Spherical fused silica powder (average particle size: 0.5 μm, maximal particle size: 1 μm)

[Silica Powder b]

Spherical fused silica powder (average particle size: 15 μm, maximal particle size: 96 μm)

[Mold-Releasing Agent]

Polyethylene wax

[Flame Retarder]

Brominated phenol novolak-type epoxy resin (epoxy equivalent: 280 g/eq.)

[Flame Retardant Aid]

Antimony trioxide

[Pigment]

Carbon black

[Silane Coupling Agent]

β-(3,4-Epoxycyclohexyl)ethyl trimethoxysilane

Examples 1 to 8 and Comparative Examples 1 to 4

Each of the raw materials shown in Table 1 or 2 was simultaneously added in proportions as shown in the same table, and the mixture was melt-kneaded for a sufficient period of time with a heat roller heated to 95° C. (kneading time by the heat roller being also shown together in Table 1 or 2), and then cooled. Thereafter, the resulting product was pulverized, to give a 10 mesh-pass powdery epoxy resin composition.

TABLE 1

(parts by mass)

| | Examples | | | | | |
|---|---|---|---|---|---|---|
| | 1 | 2 | 3 | 4 | 5 | 6 |
| Epoxy Resin a | — | — | — | 13.4 | — | — |
| Epoxy Resin b | — | — | — | — | 13.0 | — |
| Epoxy Resin c | 13.9 | — | 17.6 | — | — | 13.9 |
| Epoxy Resin d | — | 17.9 | — | — | — | — |
| Phenolic Resin a | — | 6.6 | 6.9 | — | — | — |
| Phenolic Resin b | — | — | — | 11.1 | — | — |
| Phenolic Resin c | — | — | — | — | 11.5 | — |
| Phenolic Resin d | 10.6 | — | — | — | — | 10.6 |
| Curing Accelerator | 0.3 | 0.2 | 0.3 | 0.4 | 0.3 | 0.3 |
| Hollow Inorganic Filler a | 21.7 | 21.7 | 21.7 | 21.7 | 21.7 | 21.7 |
| Hollow Inorganic Filler b | — | — | — | — | — | — |
| Silica Powder a | — | — | — | — | — | 4.2 |
| Silica Powder b | — | — | — | — | — | — |
| Flame Retarder | 3.5 | 3.5 | 3.5 | 3.5 | 3.5 | 3.5 |
| Flame Retardant Aid | 2.5 | 2.5 | 2.5 | 2.5 | 2.5 | 2.5 |
| Mold-Releasing Agent | 0.5 | 0.5 | 0.5 | 0.5 | 0.5 | 0.5 |
| Pigment | 0.3 | 0.3 | 0.3 | 0.3 | 0.3 | 0.3 |
| Silane Coupling Agent | 0.2 | 0.2 | 0.2 | 0.2 | 0.2 | 0.2 |
| Kneading Time (minutes) with Heat Roller | 5 | 5 | 5 | 5 | 5 | 5 |
| Total Amount of Epoxy Equivalent and Hydroxyl Group Equivalent | 481 | 396 | 375 | 367 | 366 | 481 |

TABLE 2

(parts by mass)

| | Examples | | Comparative Examples | | | |
|---|---|---|---|---|---|---|
| | 7 | 8 | 1 | 2 | 3 | 4 |
| Epoxy Resin a | — | — | — | — | 15.9 | 15.9 |
| Epoxy Resin b | — | — | — | — | — | — |
| Epoxy Resin c | 13.9 | 13.9 | 13.9 | 13.9 | — | — |
| Epoxy Resin d | — | — | — | — | — | — |
| Phenolic Resin a | — | — | — | — | 8.6 | 8.6 |
| Phenolic Resin b | — | — | — | — | — | — |
| Phenolic Resin c | — | — | — | — | — | — |
| Phenolic Resin d | 10.6 | 10.6 | 10.6 | 10.6 | — | — |
| Curing Accelerator | 0.3 | 0.3 | 0.3 | 0.3 | 0.3 | 0.3 |
| Hollow Inorganic Filler a | 18.7 | 59.7 | — | — | 21.7 | — |
| Hollow Inorganic Filler b | — | — | 21.7 | — | — | — |
| Silica Powder a | — | — | — | — | — | — |
| Silica Powder b | — | — | — | 66.6 | — | 66.6 |
| Flame Retarder | 3.5 | 3.5 | 3.5 | 3.5 | 3.5 | 3.5 |
| Flame Retardant Aid | 2.5 | 2.5 | 2.5 | 2.5 | 2.5 | 2.5 |
| Mold-Releasing Agent | 0.5 | 0.5 | 0.5 | 0.5 | 0.5 | 0.5 |
| Pigment | 0.3 | 0.3 | 0.3 | 0.3 | 0.3 | 0.3 |
| Silane Coupling Agent | 0.2 | 0.2 | 0.2 | 0.2 | 0.2 | 0.2 |
| Kneading Time (minutes) with Heat Roller | 5 | 5 | 5 | 5 | 5 | 5 |
| Total Amount of Epoxy Equivalent and Hydroxyl Group Equivalent | 481 | 481 | 481 | 481 | 301 | 301 |

Each of the powdery epoxy resin compositions obtained in Examples and Comparative Examples as described above was evaluated for the specific dielectric constant, the glass transition temperature and the moisture tolerance reliability in accordance with the methods described below. The results are shown in Tables 3 and 4.

[Determination of Specific Dielectric Constant]

Each of the powdery epoxy resin compositions was subjected to transfer-molding under the conditions of a molding pressure of 6.9 MPa, a mold temperature of 175° C., and a molding time period of 2 minutes, and thereafter the molded product was after-cured at 175° C. for 5 hours, to prepare a disc-shaped cured product having a thickness of 3 mm and a diameter of 50 mm. Thereafter, silver electrodes were prepared from a silver paste, the silver electrodes comprising a main electrode having a diameter of 30 mm, a guard electrode having a diameter of 32 mm and an opposing electrode having a diameter of 45 mm. Thereafter, the capacitance of the cured product was determined under the conditions of a detection frequency of 1 MHz and a temperature of 25° C., and the specific dielectric constant is calculated by the following equation:

$$\varepsilon = \frac{C_x \times t}{\pi \times r^2 \times \varepsilon_0}$$

wherein $\varepsilon$ is a specific dielectric constant; $\varepsilon_0$ is a dielectric constant of vacuum (air) [=0.0885 (pF/cm)]; r is a radius (cm) of the main electrode; t is a thickness (cm) of a test piece; and $C_x$ is a capacitance (pF) of the test piece.

[Glass Transition Temperature]

Each of the powdery epoxy resin compositions was subjected to transfer-molding under the same conditions as above, to prepare a cured product having a length of 20 mm, a width of 3 mm, and a thickness of 3 mm, and the cured product was after-cured at 175° C. for 5 hours. The glass transition temperature (Tg) of the resulting product was determined at a heating rate of 5° C./min. by using a thermomechanical analyzer (TMA device commercially available from Rigaku, under the model number of MG800GM).

[Moisture Tolerance Reliability]

Each of the powdery epoxy resin compositions was subjected to transfer-molding under the same conditions as above to mold in a 16-pin-DIP (dual in-line package) lead frame made of 42-Alloy, which was mounted with an element for evaluating corrosion of aluminum wiring bonded with gold wire. The molded product was after-cured at 175° C. for 5 hours, to prepare a semiconductor device. The resulting semiconductor device was subjected to a pressure cooker test (PCT test) under the conditions of 121° C. and 202.6 kPa, and a time period at which there were no electric conductivities was determined (electric failure).

TABLE 3

| | Examples | | | | | |
|---|---|---|---|---|---|---|
| | 1 | 2 | 3 | 4 | 5 | 6 |
| Specific Dielectric Constant | 2.8 | 2.9 | 2.9 | 3.1 | 3.2 | 2.8 |
| Glass Transition Temp. (° C.) | 144 | 167 | 158 | 105 | 123 | 144 |
| Time Period (hours) for Electric Failure | 200 hr or more | 200 hr or more | 200 hr or more | 200 hr or more | 200 hr or more | 200 hr or more |

TABLE 4

| | Examples | | Comparative Examples | | | |
|---|---|---|---|---|---|---|
| | 7 | 8 | 1 | 2 | 3 | 4 |
| Specific Dielectric Constant | 2.7 | 3.2 | 3.9 | 3.7 | 3.5 | 3.8 |
| Glass Transition Temp. (° C.) | 144 | 143 | 142 | 143 | 173 | 175 |

TABLE 4-continued

| | Examples | | Comparative Examples | | | |
|---|---|---|---|---|---|---|
| | 7 | 8 | 1 | 2 | 3 | 4 |
| Time Period (hours) for Electric Failure | 200 hr or more | 200 hr or more | 200 hr or more | 200 hr or more | 200 hr or more | 200 hr or more |

As is clear from the results shown in Tables 3 and 4, all of Examples have low specific dielectric constants even after being subjected to a melt-kneading process, and are excellent in the moisture tolerance reliabilities. Especially in each of Examples 1, 6 and 7 where a total amount of the epoxy equivalent and the hydroxyl group equivalent is 400 or more, an effect of reducing the specific dielectric constant is remarkable. Also, as to the glass transition temperature, the cured products of the epoxy resin composition of Examples of the present invention do not have drastically deteriorated values.

On the other hand, in Comparative Example 1, hollow glass balloons are broken down during melt-kneading because the specific dielectric constant is high and the average shell thickness is thin, even though the glass transition temperature is high and the moisture tolerance reliability is high. Comparative Example 2 has a high specific dielectric constant, so that an effect of adding the hollow glass balloon is exhibited in comparison with Example 1. Comparative Examples 3 and 4 each has a total amount of the epoxy equivalent and the hydroxyl group equivalent of less than 350, so that the high specific dielectric constant is high. Therefore, in comparison with these Comparative Examples, Examples of the present invention exhibit an effect of the organic components of the epoxy resin composition in which the hydroxyl group concentration is reduced.

As described above, the present invention provides an epoxy resin composition for encapsulating a semiconductor, wherein a total amount of the epoxy equivalent of the epoxy resin and the hydroxyl group equivalent of the phenolic resin is adjusted to a specified value or higher, and the composition further comprises a hollow inorganic filler [Component (D)] having a specified average particle size and a specified average shell thickness. This epoxy resin composition has the advantages of a low dielectric constant in which the specific dielectric constant is remarkably reduced, and excellent productivity without breaking down the hollow structure even when the hollow inorganic filler were added and melt-kneaded together with other raw materials in the preparation process of the epoxy resin composition. Therefore, the semiconductor device prepared from resin-encapsulating this epoxy resin composition has excellent high-wavelength characteristics matching the trend of high-frequency development.

Further, when a specified epoxy resin represented by the formula (1) as the epoxy resin and a specified phenolic resin represented by the formula (2) as the phenolic resin are used in combination, the specific dielectric constant of the cured product of the resulting epoxy resin composition is even more markedly reduced.

Moreover, a hollow glass balloon is used as the hollow inorganic filler, so that the lowering of the dielectric constant can be achieved. Also, a semiconductor device is obtained by molding the epoxy resin composition of the present invention, so that the weight of the semiconductor device can be reduced.

It is clear from these findings that since the semiconductor device of the present invention is a resin-encapsulating type semiconductor device matching the trend of high-frequency development, which can well substitute conventional ceramic-encapsulating type semiconductor devices, in addition to the assets of conventional characteristics of being excellent in various reliabilities and mass-productivity, and low in costs.

EQUIVALENTS

The present invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An epoxy resin composition for encapsulating a semiconductor device comprising as essential components:
   (A) an epoxy resin;
   (B) a phenolic resin;
   (C) a curing accelerator; and
   (D) a hollow inorganic filler having an average particle size of 4 to 100 μm and an average shell thickness of 1.5 μm or more,
wherein the amounts of the component (A) and the component (B) are adjusted such that a total amount of X and Y (X+Y) is 350 or more, wherein X is an epoxy equivalent of the epoxy resin (A), and Y is a hydroxyl group equivalent of the phenolic resin (B).

2. The epoxy resin composition according to claim 1, wherein the epoxy resin (A) is an epoxy resin represented by the following formula (1):

(1)

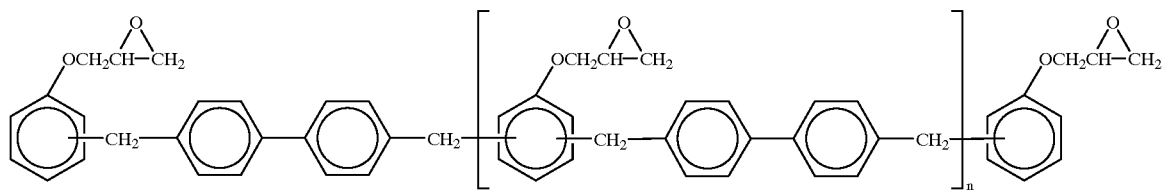

wherein n is 0 or a positive number, and
wherein the phenolic resin (B) is a phenolic resin represented by the following formula (2):

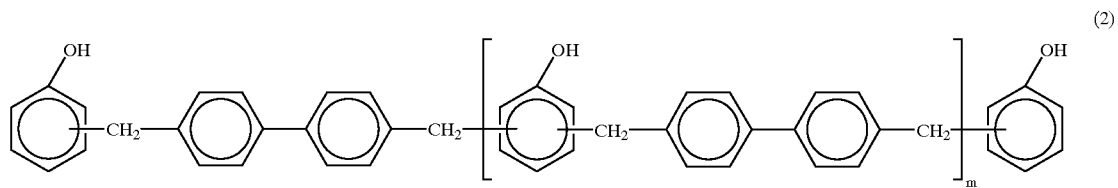

wherein m is 0 or a positive number.

3. The epoxy resin composition according to claim 1, wherein a ratio of the hydroxyl group equivalent in the phenolic resin to the epoxy equivalent in the epoxy resin is within the range of 0.5 to 1.6.

4. The epoxy resin composition according to any one of claims 1 to 3, wherein the hollow inorganic filler (D) has a maximal particle size of 150 μm or less.

5. The epoxy resin composition according to claim 4, wherein the hollow inorganic filler (D) is a hollow glass balloon.

6. The epoxy resin composition according to claim 1, wherein the hollow inorganic filler (D) is contained in an amount of 40 to 70% by mass of an entire epoxy resin composition.

7. A semiconductor device comprising a semiconductor element encapsulated by the epoxy resin composition of claim 1.

* * * * *